(12) United States Patent
Oh (10) Patent No.: US 6,982,911 B2
(45) Date of Patent: Jan. 3, 2006

(54) MEMORY DEVICE WITH COMMON ROW INTERFACE

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 40 days.

(21) Appl. No.: 10/805,024

(22) Filed: Mar. 18, 2004

(65) Prior Publication Data

US 2005/0207258 A1 Sep. 22, 2005

(51) Int. Cl.
*G11C 29/00* (2006.01)
(52) U.S. Cl. ............. 365/200; 365/230.03; 365/189.07
(58) Field of Classification Search ................. 365/200, 365/230.03, 189.07
See application file for complete search history.

(56) References Cited

U.S. PATENT DOCUMENTS

| | | | |
|---|---|---|---|
| 5,309,393 A * | 5/1994 | Sakata et al. .......... | 365/230.03 |
| 5,337,277 A | 8/1994 | Jang | |
| 5,422,850 A | 6/1995 | Sukegawa et al. | |
| 5,691,946 A | 11/1997 | DeBrosse et al. | |
| 6,101,138 A | 8/2000 | Shiah et al. | |
| 6,178,125 B1 | 1/2001 | Niiro | |
| 6,388,925 B1 | 5/2002 | Kim | |
| 6,445,628 B1 | 9/2002 | Pereira et al. | |
| 6,847,565 B2 * | 1/2005 | Abedifard et al. .......... | 365/200 |
| 2002/0093872 A1 | 7/2002 | Tomita | |
| 2002/0196680 A1 | 12/2002 | Ooishi et al. | |

FOREIGN PATENT DOCUMENTS

EP 0 945 802 9/1999

OTHER PUBLICATIONS

Copy of PCT International Search Report for International Application No. PCT/EP2005/001896 (4 pgs.).

* cited by examiner

*Primary Examiner*—Huan Hoang
(74) *Attorney, Agent, or Firm*—Dicke, Billig & Czaja, PLLC (57) ABSTRACT

One embodiment of the present invention provides a semiconductor memory receiving an external address including an array address and a row address. The semiconductor memory includes a memory bank having N arrays, each array having an array address and a plurality of primary rows of memory cells and a plurality of redundant rows of memory cells, a redundancy block, and N local row control blocks. The redundancy block provides a match signal having an active state when the external address matches one of a plurality of defective addresses, provides a redundant row address when the match signal has the active state, and provides a redirected array address comprising a redundant array address when the match signal has the active state and otherwise comprising the external array address. Each of the N local row control blocks is associated with a different one of the N arrays, wherein the local row control block associated with the array whose address matches the redirected array address opens a redundant row of memory cells for access based on the redundant row address when the match signal has the first state, and otherwise opens a normal row of memory cells for access based on the external row address.

23 Claims, 7 Drawing Sheets

| | L-H delay represents | H-L delay represents |
|---|---|---|
| Delay-1 | EQ/MUX off to WL On time | WL Off by +WLDrv# to XDEC off time |
| Delay-2 | Not applicable | GXA23/45/678 or Red_xdec<3:0> Off time to precharge enable for XDEC |
| Delay-3 | WL On to full signal transfer to BL S/A | WL Off to EQ/MUX On time |

Fig. 6

MEMORY DEVICE WITH COMMON ROW INTERFACE

BACKGROUND

Conventional semiconductor memory devices utilizing multiple array memory structures, such as synchronous dynamic random access memory (SDRAM) devices and pseudo-static random access memory (PSRAM) devices employing bank architecture, generally employ some type of row redundancy scheme. Row redundancy involves replacing defective wordlines, or rows of memory cells, with non-defective wordlines. A wordline can be defective for many reasons including short circuits to bitlines or bad transistors or storage capacitors in the associated memory cells.

When a defective row is replaced, it is not physically replaced, but logically replaced. Typical row redundancy schemes compare a received row address to address of known defective rows. If the comparison produces a match, a replacement, or redundant, row is fired in place of the defective "normal" row. In a memory device employing a bank structure, the location of the replacement row is not restricted to the array containing the defective row, and the replacement row can generally reside in any array within the bank.

In a random access memory device utilizing bank architecture, row redundancy schemes are typically implemented via redundancy circuits, with one redundancy circuit being associated with and being located proximate to each of the memory arrays within the bank. Each redundancy circuit checks incoming addresses intended for its corresponding array against known defective rows of the array and communicates with the other redundancy blocks of the bank to redirect the addresses to predetermined replacement rows within the bank when access of a defective row is requested. While such a scheme is effectively provides row redundancy to the memory device, providing a redundancy circuit at each array can consume a large amount of integrated circuit area.

Memory devices with bank architecture also generally employ a row control circuit at each array for generating timing signals associated with row operations. Each row control circuit, in response to receiving a global row operation initiating signal and the address of its associated array, locally generates all timing signals and related delays necessary for performing a row operation in the associated array. While such a scheme is effectively generates the necessary timing signal to carry-out row operations, generating all timing signals with a row control circuit at each array can also consume a large amount of integrated circuit area. Also, adjustments in delays between timing signals can be cumbersome and time consuming, as such adjustments must be made in the row control circuit at each array.

SUMMARY

One embodiment of the present invention provides a semiconductor memory receiving an external address including an array address and a row address. The semiconductor memory includes a N memory arrays, each memory array having an array address and a plurality of normal rows of memory cells and a plurality of redundant rows of memory cells, a redundancy block, and N local row control blocks. The redundancy block provides a match signal having an active state when the external address matches one of a plurality of defective addresses, provides a redundant row address when the match signal has the active state, and provides a redirected array address comprising a redundant array address when the match signal has the active state and otherwise comprising the external array address. Each of the N local row control blocks is associated with a different one of the N memory arrays, wherein the local row control block associated with the memory array whose array address matches the redirected array address opens a redundant row of memory cells for access based on the redundant row address when the match signal has the first state, and otherwise opens a normal row of memory cells for access based on the external row address.

DETAILED DESCRIPTION

In the following Detailed Description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
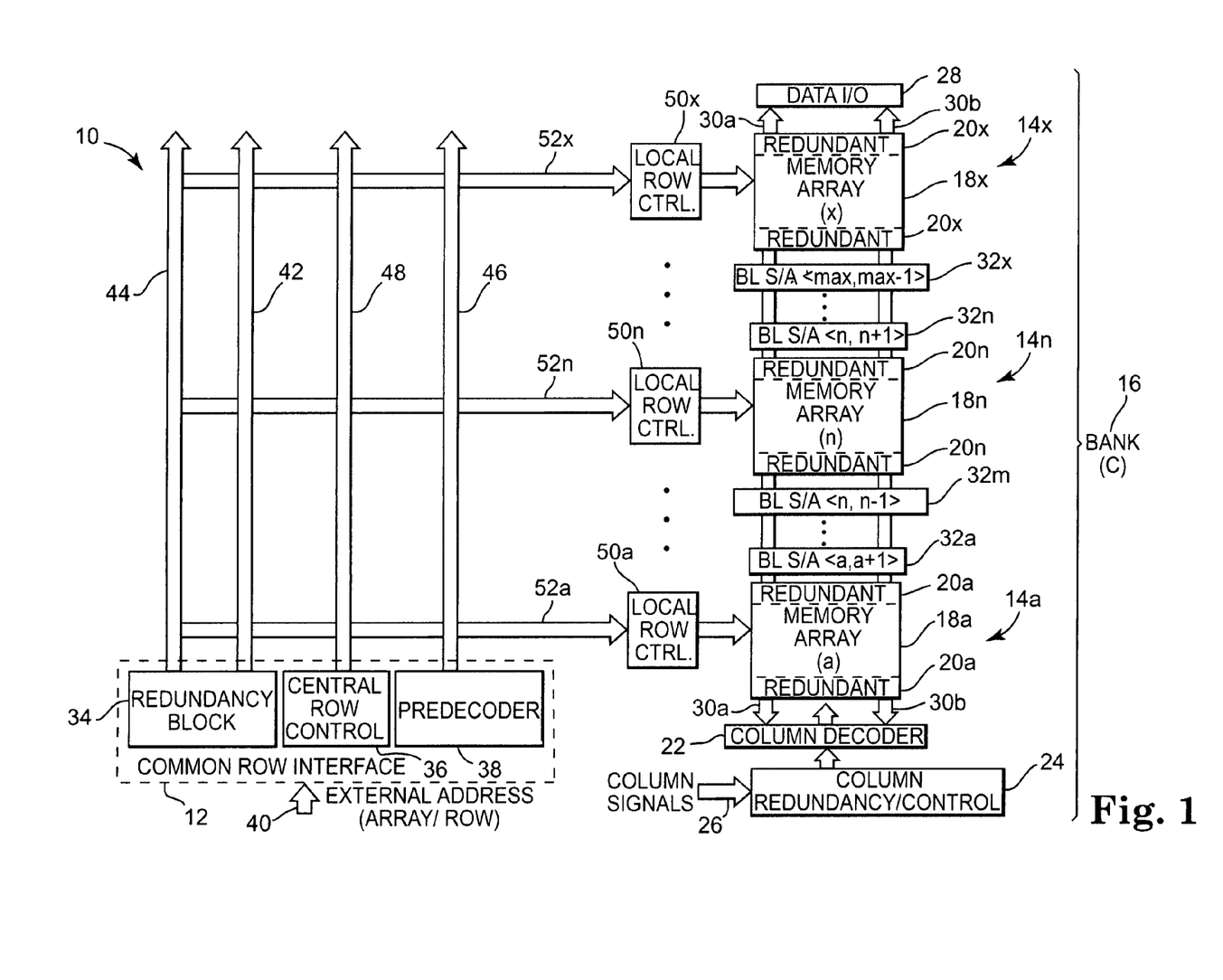
FIG. 1 is a block diagram illustrating generally one exemplary embodiment of a random access memory device employing a common row interface according to the present invention.

FIG. 1 is a block diagram illustrating generally one exemplary embodiment of a random access memory (RAM) device 10 having a banked memory array structure employing a common row interface 12 according to the present invention. Common row interface 12 is configured to decrease the integrated circuit area required by RAM 10 and to simplify adjustment of delays of row operation timing signals associated with memory transactions to memory arrays within the bank by substantially centralizing row redundancy and timing signal operations for the bank rather than duplicating these operations at each array.

RAM device 10 includes a plurality of memory arrays 14, illustrated as arrays 14a to 14x, which together from a memory bank, such as memory bank <c> illustrated at 16. Each memory array 14 includes a plurality of memory cells arranged in rows and columns, with rows sharing conductive row select lines or wordlines, and columns sharing conductive column select lines or bitlines. Each array contains a plurality of normal rows of memory cells (normal rows) 18 and a plurality of redundant rows of memory cells (redundant rows) 20. Each memory array 14 has a corresponding array address, each normal row 18 a corresponding row address, and each redundant row 20 a corresponding redundant row address.

Normal rows 18 are employed to store data associated with its corresponding memory array 14, while redundant rows 20 are assigned at manufacture as logical replacements for defective rows within the memory array 14 in which it is located or other memory arrays 14 within bank <c> 16. At manufacture, each defective row is logically assigned to a corresponding "redundant" array and a corresponding redundant row 20 within the redundant array 14. In one embodiment, as illustrated, each memory array 14 includes four redundant rows, with the first two rows and the last two rows of memory cells of the array being redundant rows.

Each memory array 14 is coupled to a column decoder 22 and a column redundancy and control block 24 which receives column address and timing control signals at 26. Each array is further coupled to data input output circuitry 28 via global data buses 30 and bit line sense amp (BL S/A) arrays 32. As illustrated, bank <c> 16 employs a "folded" array architecture wherein each BL S/A array 32 is coupled to bitlines of adjacent arrays to form bitline pairs for improved sensing. For example, BL S/A array 32m is coupled to memory array <n> 14n and to memory array <n-1> (not shown) and BL S/A array 32m is coupled to memory array <n> 14n and memory array <n+1> (not shown).

Common row interface 12 includes a redundancy block 34, a central row controller 36 and a predecoder 38. Common row interface 12 receives an external address at 40, the external address including an array address and a row address. Redundancy block 34 compares the external address to each of a plurality of defective address, each defective address having a corresponding redundant array address and redundant row address, and provides a match signal having an active when the external address matches a defective address. Redundancy block 34 provides a redirected array address via a bus 42, wherein the redirected array address comprises the redundant array address corresponding to the matching defective address when the match signal has the active state, and otherwise comprises the external array address. Redundancy block 34, when the match signal has the active state, further provides via a bus 44 the redundant row address of the matching defective address.

Predecoder 38 provides a predecoded row address via a bus 46, wherein the predecoded row address is based on the external row address. Predecoding is a standard technique known to those in the art, wherein a predecoded address is formed by logically combining (e.g. AND) address lines. Central row controller 36, upon redundancy block 34 providing a redirected array address via bus 42, is configured to provide via a bus 48 a series of timing signals having tunable delays, wherein the timing signals comprise a portion of a row access operation of a row of memory cells within bank <c> 16.

Each memory array 14 is coupled to buses 42, 44, 46, and 48 via local row control blocks 50, indicated as 50a to 50x. The local row control block 50 associated with the array 14 whose array address matches the redirected array address provides to the array a plurality of access signals based on the timing signals, redundant row address, and predecoded row address, wherein the timing signals and access signals together constitute the row access operation. The access signals provided by local row control block 50 are such that a redundant row 20 is opened for access based on the redundant row address when the match signal has the active state, with a normal row 18 otherwise being opened for access based on the predecoded address.

By providing redundant row and array addresses via redundancy block 34 and by providing timing signals associated with a row access operation via central row control block 36, common row interface decreases the integrated circuit area required by random access memory device 10. Additionally, by consolidating the generation of timing signals at a single location, required adjustments to the timing signals need only be made at a single location in lieu of at each memory array as previously required.

Figure 2:
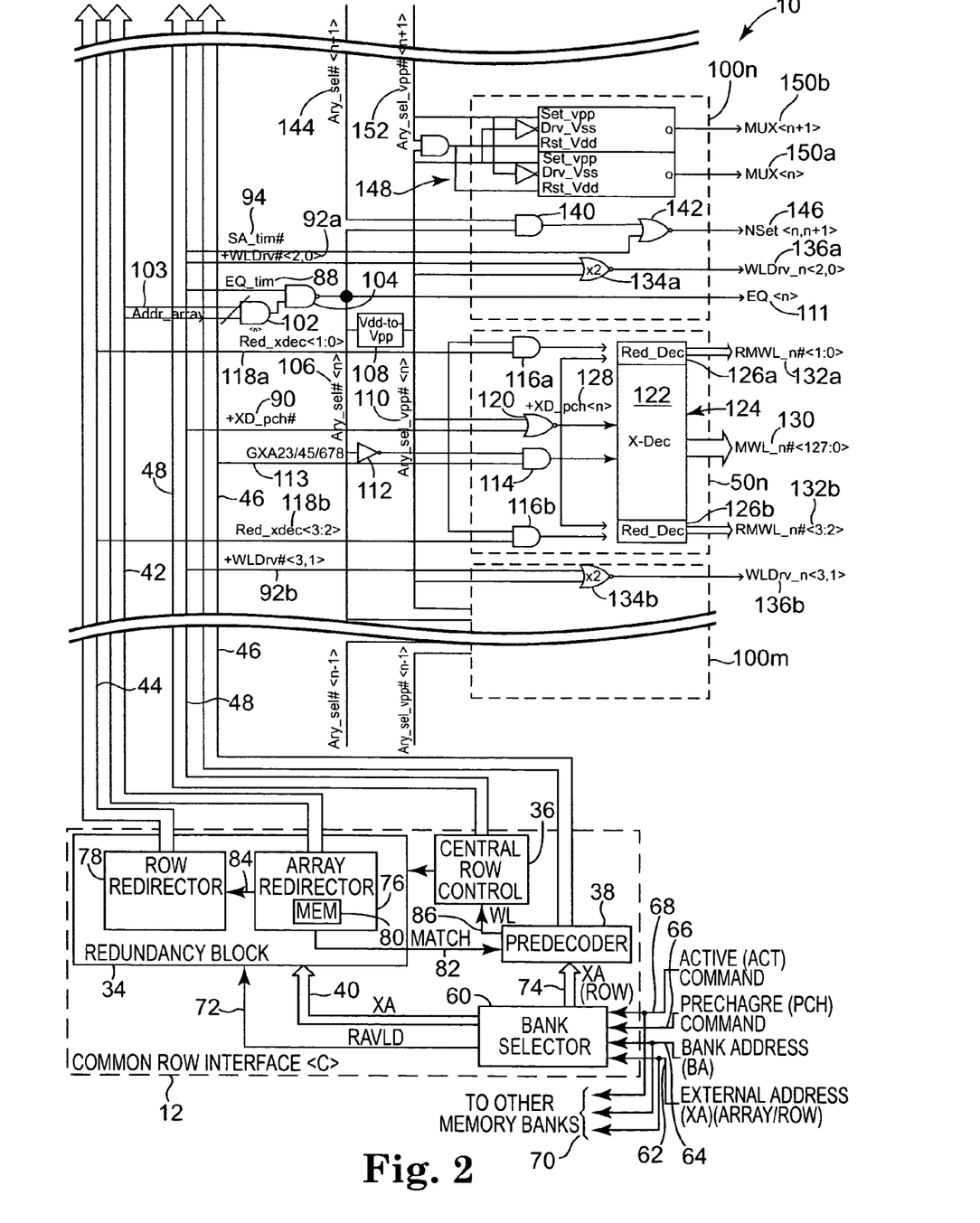
FIG. 2 is a schematic and block diagram illustrating another exemplary embodiment of a random access memory device according to the present invention.

FIG. 2 is a schematic and block diagram illustrating one exemplary embodiment of RAM device 10 according to the present invention. In the illustrated embodiment, RAM device 10 employs a multiple bank structure, with each bank having a corresponding bank address. For illustrative purposes, however, only memory bank <c> 16 and circuitry associated with memory array <n> and portions of circuitry associated with adjacent memory arrays (<n+1> and <n-1>) are shown. Although not shown, each memory bank is similar in structure to memory bank <c> 16, including a plurality of memory arrays and a common row interface.

Common row interface 12, in addition to redundancy block 34, central row controller 36, and predecoder 38, further includes a bank selector 60. Bank selector 60 is configured to receive the external address (XA) at 62, a bank address (BA) at 64, a precharge (PCH) command (PCH) 66, and an active (ACT) command at 68, wherein ACT command 68 activates a bank transaction within memory device 10. XA at 62, BA at 64, and ACT command at 68 are global commands and provided to a common row interface associated with each memory bank 16 of memory device 10 as indicated at 70. When BA at 64 matches the bank address of the memory bank to which bank selector 60 is associated, as illustrated memory bank <c> 16, and based on the PCH and ACT commands at 66 and 68, bank selector passes XA to redundancy block 34 at 40, provides a row activation validation (RAVLD) signal to redundancy block 34 at 72, and provides the row address portion of XA to predecoder 38 at 74.

In the illustrated embodiment of FIG. 2, redundancy block 34 further includes an array redirector 76 and a row redirector 78. As described briefly above, in the illustrated embodiment, each memory array 14 of bank <c> 16 includes four redundant rows, with the first two rows and the last two rows of memory cells of the array being redundant rows. In other words, each of the redundant rows of each memory array can be said to be located at one of four redundant row positions. At manufacture, each of the four redundant rows of memory cells 20 can be assigned as logical replacements for defective rows of memory cells in any of the memory arrays 14 with bank <c> 16.

Array redirector 76 includes a memory 80 having a plurality of memory locations therein, with each of the memory locations associated with a different one of the redundant rows of bank <c> 16 and, consequently, associated with one of the four redundant row positions. Stored within each memory location of memory 80 is the address of the defective row, including an array address and a row address, for which the redundant row associated with the memory location is a logical replacement.

Array redirector 76 compares XA at 40 to the defective row addresses stored in each memory location of memory 80. If no match occurs, array redirector provides at 42 a redirected array address comprising the array address of XA at 40.

If a match occurs, array redirector 76 provides at 42 a redirected array comprising the array address of the array having the redundant row corresponding to the memory location holding the matching defective address. When a match occurs, array redirector 76 also provides at 82 a MATCH signal having an active state, and provides at 84 a position signal indicative of the redundant row position corresponding to the memory location holding the matching defective address.

Based on the position signal at 84, row redirector 78 provides a redundant address at 44. In one embodiment, as illustrated, the redundant row address comprises four redundant row signals (Red_Xdec<3:0>) indicative of the redundant row position of the redundant row assigned as the logical replacement for the defective row address matching XA at 40.

Predecoder 38 provides at 46 a predecoded row address based on the external row address received at 74 and also provides to central row controller 36 a driver signal at 86 indicative of a wordline driver associated with the predecoded address. Predecoder 38 is disabled when the MATCH signal at 82 has the active state.

After array redirector 76 provides a redirected array address at 42, central row controller 36 generates and provides at 42 a series of global (within bank <c> 16) timing signals required for the row operation within memory bank <c> 16. The series of timing signals includes an equilibration timing signal (EQ_tim) at 88, a precharge signal (+XD_pch) at 90, wordline driver signals (+WLDrv#<2, 0> and +WLDrv#<3,1>) at 92a and 92b, and a sense amp timing signal (SA_tim#) at 94.

The local row control block corresponding to memory array 14n is illustrated at 50n and portions of BL S/A control blocks corresponding to BL S/A arrays 32m and 32n are indicated respectively at 100m and 100n. Local row control block 50n includes a plurality of AND-gates 102 receiving the redirected array address at 103, and a NAND-gate 104 receiving EQ_tim 88 and the output of AND-gate 102. The output of NAND-gate 104 is indicated at 106 as array select signal (Ary_sel#<n>). Ary_sel#<n> 106 has a low state only when the redirected array address at 103 matches the array address of memory array <n> 14n and EQ_tim 88 is present. Ary_sel#<n> also serves as the local equilibration signal EQ<n>, indicated at 111. A voltage translator 108 steps a voltage level of Ary_sel#<n> 106 from a level Vdd (from a supply voltage rail) to a level Vpp to thereby provide Ary_sel_Vpp# at 110.

An inverter 112 inverts Ary_sel#<n> 106 at an output. A plurality of AND-gates 114 receives the output of inverter 112 and the predecoded row address (GXA23/45/678) at 113. A first pair of AND-gates 116a receives the output of inverter 112 and redundant row signals (Red_Xdec<1:0>) 1118a indicative of the first two redundant row positions of memory array 14n. A second pair of AND-gates 116b receives the output of inverter 112 and redundant row signals (Red_Xdec<3:2>) 118b indicative of the last two redundant row positions of memory array 14n. A NOR-gate 120 receives the output of inverter 112 and +XD_pch# 90.

A row decoder 122 includes a decoder portion 124 for decoding predecoded row address GXA23/45/678 at 113 corresponding to the so-called normal rows of memory cells 18. Row decoder 122 further includes a pair of decoder portions 126a, 126b for respectively decoding the redundant row signals Red_Xdec<1:0> 118a and Red_Xdec<3:2> 118b (together constituting the redundant row address) indicative of the redundant row position of the redundant row assigned as the logical replacement for the defective row address matching XA at 40.

AND-gates 114, 116a, and 116b function as "pass" gates to provide either the predecoded address GXA23/45/678 or the redundant row signals Red_Xdec<1:0> 118a and Red_Xdec<3:2> 118b to row decoder 122 based on the state of Ary_sel#<n> 106, which in-turn is based on the redirected array address at 103 and a state of EQ_tim 88. When the output of inverter 112 is at HIGH (meaning that Ary_sel#<n> 106 is low), AND-gate 114 will pass GXA23/45/678 at 113 to decoder section 124 if it is a valid address, AND-gates 116a will pass Red_Xdec<1:0> 118a to section 126a if either signal is HIGH, and 116b will pass Red_Xdec<3:2> 118b to section 126b if either signal is HIGH.

NOR-gate 120 provides a local precharge signal (+XD_pch<n>) 128 which indicates a status of precharge operations within corresponding memory array <n> 14n to row decoder 122. NOR-gate 120 passes the status of precharge operations to row decoder 122 only when Ary_sel_vpp#<n> is LOW, which means that memory array <n> has been selected for access via redirected array address 103 and that EQ_tim 88 is HIGH.

Decoder portion 124 provides wordline signals MWL_n#<127:0> at 130 for normal rows of memory cells 18 based on the predecoded row address GXA23/45/678 at 113 and +XD-pch<n> at 128. Deocoder portion 126a provides wordline signals RMWL_n#<1:0> at 132a for redundant rows of memory cells 20 in the first two row positions of memory array <n> 14n based on redundant row signals Red_Xdec<1:0> 118a and +XD-pch<n> at 128. Similarly, deocoder portion 126b provides wordline signals RMWL_n#<3:2> at 132b for redundant rows of memory cells 20 in the last two row positions of memory array <n> 14n based on redundant row signals Red_Xdec<3:2> 118a and +XD-pch<n> at 128.

Local row control block 50n further includes a first pair of NOR-gates 134a and a second pair of NOR-gates 134b which provide local wordline driver signals to memory array <n> 14n. In the illustrated embodiment, memory array <n> 14n includes four wordline drivers (not shown), wherein the four wordline driver signals +WLDrv#<3:0> each correspond to a different one of the four wordline drivers. The first pair of NOR-gates 134a provides local wordline driver signals WLDrv_n<2,0> 136a to memory array <n> 14n based on the status of wordline driver signals +WLDrv#<2, 0> at 92a when Ary_sel_vpp#<n> 110 is LOW. Similarly, the second pair of NOR-gates 134b provides local wordline driver signals WLDrv_n<3, 1> 136b to memory array <n> 14n based on the status of wordline driver signals +WLDrv#<3,1> at 92b when Ary_sel_vpp#<n> 110 is LOW.

BL S/A control blocks 100m and 100n are respectively associated with and provide control signals to BL S/A arrays 32m and 32n. BL S/A control blocks 100m and 100n are similar in structure, therefore, only BL S/A control block 100n is described herein.

BL S/A control block 100n includes an AND-gate 140 and a NOR-gate 142. AND-gate 140 receives Ary_sel#<n> 106 at a first input, and a similar signal, Ary_sel#<n−1> 144, from a local row control block corresponding to adjacent memory array <n+1> (both of which are not shown). NOR-gate 142 receives the output of AND-gate 140 and the SA_tim# signal 94, and provides an NSet <n, n+1> signal at 146 to BL S/A array <n, n+1> 32n. The NSet <n, n+1> signal 146 initiates a sensing operation by BL S/A array <n, n+1> 32n.

Figure 3:
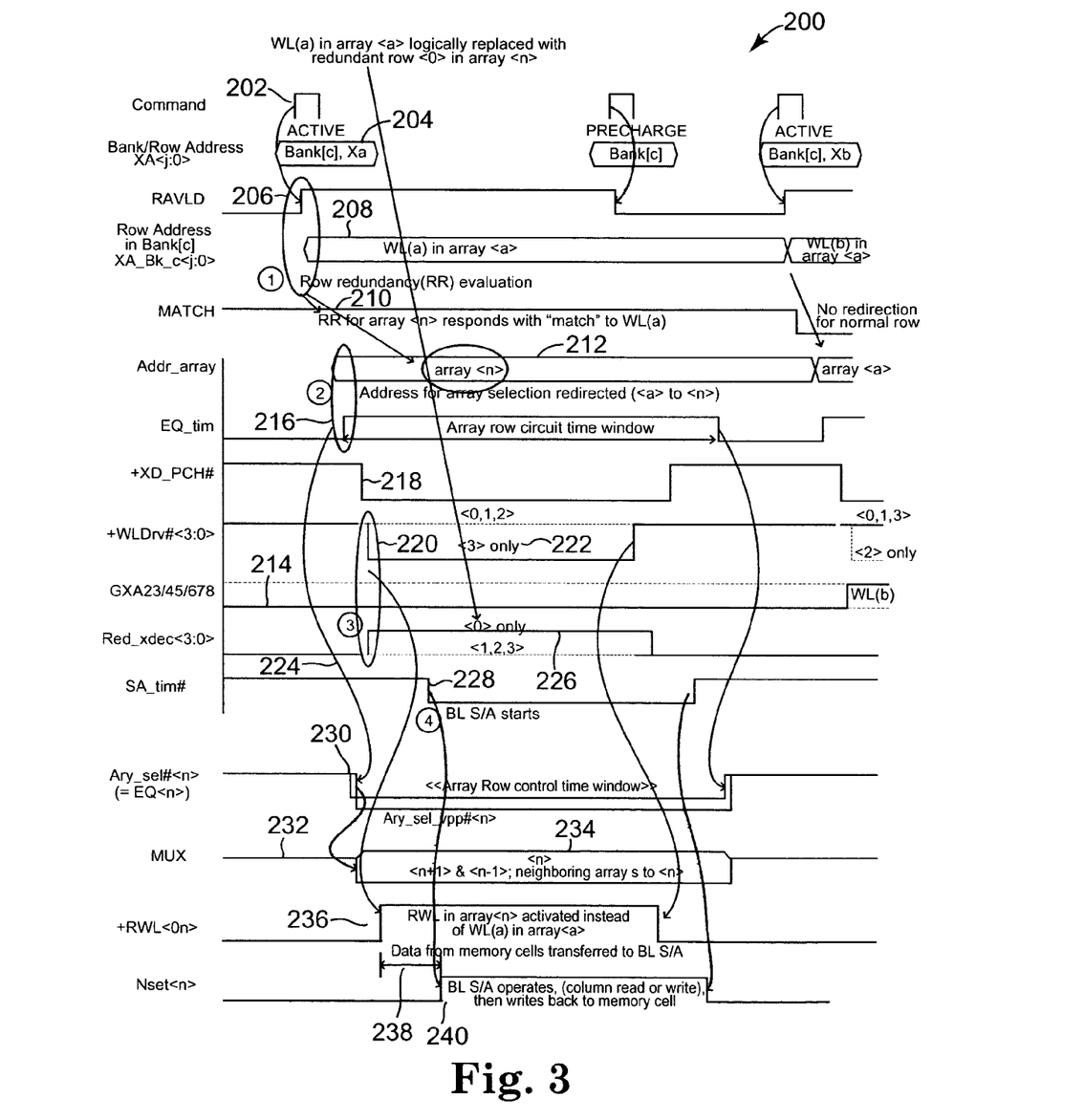
FIG. 3 is a timing diagram illustrating an example operation of the memory device of FIG. 2.

BL S/A control block 100n also includes a plurality of logic gates and drivers 148 providing MUX<n> and MUX<n+1> signals 150a and 150b to BL S/A array <n, n+1> 32n. MUX<n> 150a and MUX<n+1> 150b indicate to BL S/A array <n, n+1> 32n the memory array of the folded array structure, in this case memory arrays 14n or 14(n+1), whose bitlines are to function as a reference and whose bitlines are to be sensed in the bitline or column pairs. The status of MUX<n> 150a and MUX<n+1> 150b are based on Ary_sel_vpp#<n> 110 and a similar signal, Ary_sel_vpp#<n+1> 152, from the local row control block corresponding to adjacent memory array FIG. 3 is a timing diagram 200 illustrating the operation of memory device 10 according to the present invention as illustrated by FIG. 2. Timing diagram 200 illustrates the operation of memory device 10 an external device attempts to access a defective wordline "a" (WL(a)) in memory array <a> 14a of bank <c> 16, which has been logically assigned to the first redundant row position of memory array <n> 14n of bank <c> 16.

Bank selector 60 receives an active (ACT) command at 202 and the address for bank <c> 16, the address for memory array <a> 14a, and a row address for WL(a) at 204. Since the bank address matches the address of bank<c> 16, bank selector 60 provides to redundancy block 34 the RAVLD signal at 72 having a HIGH state as indicated at 206, and passes the array address and row address to redundancy block 34 and the row address to predecoder 38, as indicated at 208.

Array detector 76 compares the array and row address for WL(a) of memory array <a> 14a to known defective addresses. Since the row address for WL(a) in memory array <a> 14a is defective and has been assigned to the first redundant row position of memory array <n> 14n, array detector 76 provides the match signal having a HIGH state as indicated at 210. Array redirector 76 then provides the redirected array address comprising the array address for memory array <n> 14n as indicated at 212. Since the match signal is HIGH, predecoder 38 is disabled from providing a predecoded row address GXA23/45/678 as indicated at 214.

In response to array redirector 76 providing the redirected array address at 212, central row controller 36 provides in a timed sequence EQ_tim 88 at 216, +XD_pch# 90 at 218, and wordline driver signals +WLDrv#<3:0> at 220. Based on the driver signal 86 received from predecoder 38, central row controller 36 provide only for the wordline driver signal for the fourth wordline driver of the array at a LOW state, as indicated at 222.

Row redirector 78, based on the position signal at 84 indicative of the redundant row position as received from array redirector 76, provides a redundant row address as indicated at 224. Because the redundant row for WL(a) in memory array <a> 14a is in the first redundant row position in memory array <n> 14n, row redirector 78 provides a HIGH state only for the wordline driver signal corresponding to the first row position as indicated at 226.

In response to the states of EQ_tim 88 and redirected array address 103, as indicated at 212 and 216, the Ary_sel#<n> 106 and Ary_sel_vpp#<n> 110 signals transition from HIGH to LOW, as indicated at 230. In turn, as indicated at 232 and 234, the state of MUX <n> 150a for memory array <n> 14n incremented upward, while the states of MUX signals for adjacent memory arrays <n+1> and <n−1> are set LOW.

In response to Ary_sel#<n> being LOW, and thus the output of inverter 112 being HIGH, decoder portion 126a of row decoder 122 provides a redundant wordline signal having a HIGH state based on Red_xdec<1:0> 188a (redundant row address) as indicated at 236. Additionally, after a time period 238 while data is transferred to from cells of memory array <n> 14 to BL S/A array 32n, BL S/A control block 100n provides NSet <n> HIGH, as indicated at 240, to initiate a sensing operation.

Figure 4:
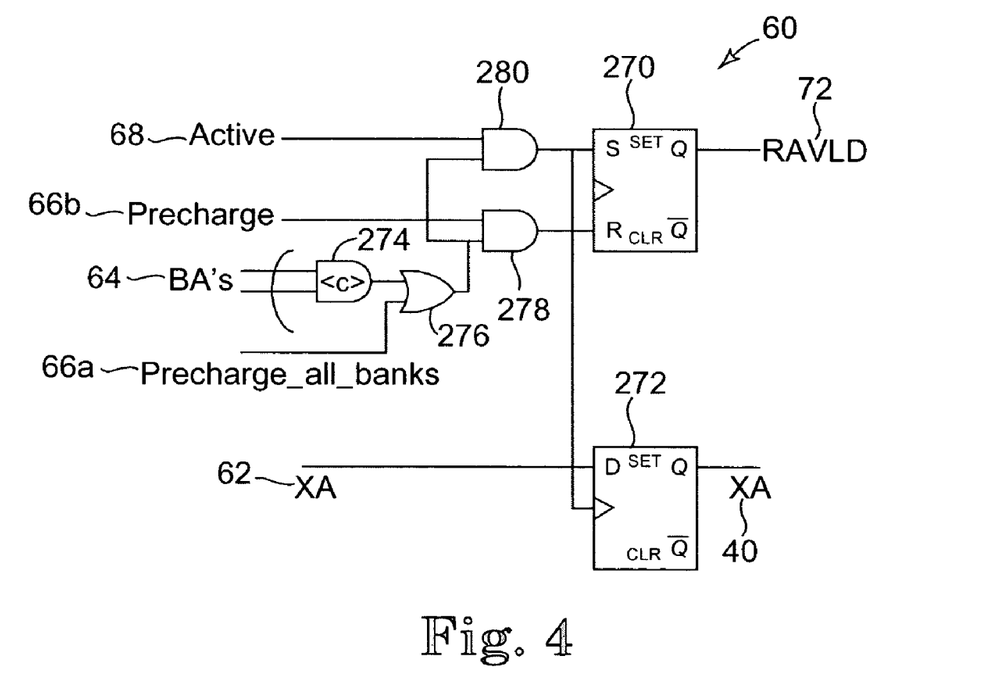
FIG. 4 is a schematic diagram illustrating one exemplary embodiment of bank selector block of a common row interface according to the present invention.

FIG. 4 is a schematic diagram illustrating one exemplary embodiment of bank selector 60 of common row interface 12 according to the present invention. Bank selector 60 includes an SR flip-flop 270, a D flip-flop 272, an AND-gate 274, an OR-gate 276, and AND-gate 278, and an AND-gate 280. AND-gate 274 receives the bank address (BA) at 64. OR-gate 276 receives the output of AND-gate 274 at a first input, and a "precharge_all_banks" command 66a at a second input.

AND-gate 278 receives a "precharge" command 66b at a first input, and the output of OR-gate 276 at a second input. AND-gate 280 receives the ACT command at 68 and the output of OR-gate 276 at a second input.

SR flip-flop receives the output of AND-gate 280 at the "S" input, the output of AND-gate 278 at the reset ("R") input, and provides the RAVLD signal at the "Q" output at 72. D flip-flop 272 receives the external address (XA) 62 at the "D" input, the output of AND-date 280 at the clock input, and provides the external row address to redundancy block 34 as indicated at 40.

When array address BA matches the bank address of bank <c> 14, AND-gate 274 provides a HIGH output. If ACT 68 is also HIGH, SR flip-flop 270 sets RAVLD at 72 HIGH, and D flip-flop 272 latches external address XA to the input of redundancy block 34 at 40. When precharge command 66b is subsequently set HIGH, SR flip-flop 270 is reset, causing RAVLD at 72 to be set LOW. Precharge_all_banks command 66a, together with precharge command 66b, resets SR flip-flop 270 regardless of whether bank address XA at 64 is valid for corresponding memory array <n> 14n.

Figure 5A:
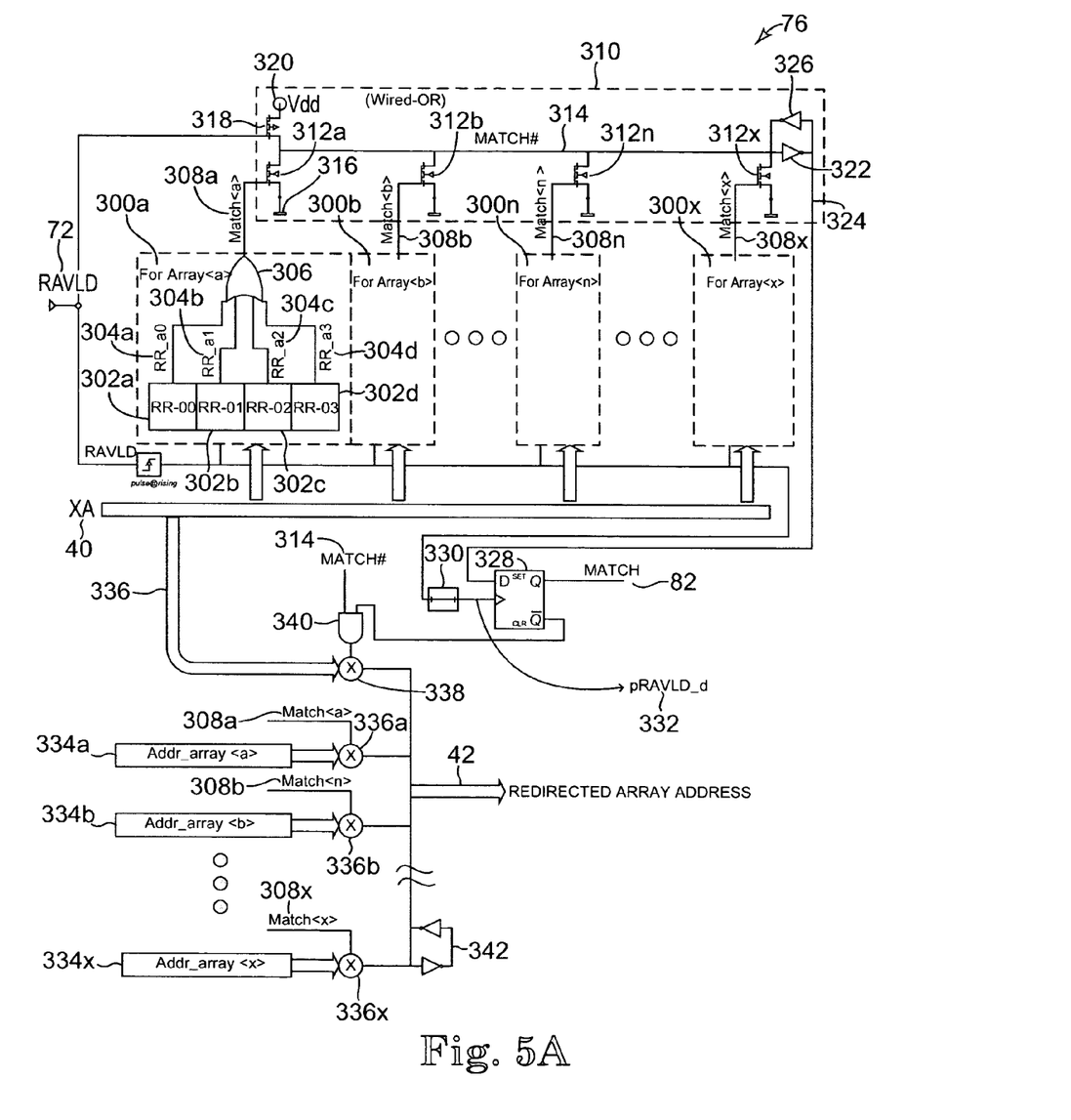
FIG. 5A is a block and schematic diagram illustrating one exemplary embodiment of an array redirector of a common row interface according to the present invention.

FIG. 5A is a block and schematic diagram illustrating one exemplary embodiment of array redirector 76 of common row interface 12 according to the present invention. Array redirector 76 includes a plurality of comparator blocks 300, indicated as 300a to 300x, with each comparator block associated with one of the memory arrays 14 of bank <c> 16. Since each comparator block 300 is similarly configured, only comparator block 300a corresponding to memory array <a> 14a is illustrated and described herein.

Comparator block 300a includes four comparator circuits 302, each corresponding to one to the four redundant row positions of memory array <a> 14a, with comparator circuits 302a and 302d corresponding respectively to the first and fourth redundant row positions. Each of the four comparator circuits 302a to 302d stores in a memory therein the address (comprising an array address and a row address) of the defective row which has been assigned to the comparator's corresponding redundant row position in memory array <a> 14a.

Each of the comparator blocks 300a to 300x receives the external address (XA) at 40 and the RAVLD command at 72 as indicated. Upon the rising edge of the RAVLD command at 72, each of the four comparator circuits 302a to 302d compares XA at 40 to the defective row address stored therein. Each of the four comparator circuits 302 provides a row position match signal 304, indicated as 304a to 304d (and further labeled as RR_a0, RR_a1, RR_a2, and RR_a3), wherein row position match signal 304a (RR_a0) corresponds to the first redundant row position, and row redundancy match signal 304d (RR_a3) corresponds to the fourth redundant row position. If XA at 40 matches the defective row address stored therein, the comparator circuit with the matching defective row address sets its corresponding row position match signal 304 HIGH. For instance, if the defective row address stored in comparator circuit 302 matches XA at 40, comparator circuit sets RR_a0 HIGH. If no match occurs, each of the row position match signals 304 remains LOW.

Comparator block 300a further includes an OR-gate 306 receiving each of the row redundancy position signals 304a to 304d from comparator circuits 302a to 302d. If any of the row redundancy match signals is HIGH, OR-gate 306 provides an array match signal at 308a having HIGH state. Each comparator block 300 provides a corresponding array match signal, indicated as 308a to 308x.

Array redirector 76 further includes a wired-OR gate 310. Wired-OR gate 310 includes switches (e.g. transistors) 312 coupled between a match# node 314 and a reference node 316, such as ground. Each of the switches, indicated as 312a to 312x, and corresponds to one of the comparator blocks 300 and receives the array match signal 308 from the corresponding comparator block 300 at a control gate. A voltage switch (e.g. a transistor) 318 is coupled between a voltage source (Vdd) 320 and match# node 314, and receives RAVLD 72 at a control gate. When RAVLD is HIGH (i.e. a row operation has been initiated), switch 318 closes and match# node 314 is set HIGH.

If any of the array match signals 308a to 308x subsequently are set HIGH, indicating that XA at 40 is a defective address, match# node 314 will be pulled to ground 316 and set LOW. A first inverter 322 provides at an output 324 having the opposite state of match# node 314. A second inverter 324, together with first inverter 322, forms a latch to maintain output 324 at a present state until a next RAVLD 72 signal is received.

The output 324 of inverter 322 is coupled to the "D" input of a D flip-flop 328. A delay element 330 receives RAVLD 72 and provides a delayed RAVLD signal (pRAVLD_d) at 332, which is received at the clock input of D flip-flop 328. When pRAVLD_d at 332 is set HIGH, D flip-flop 328 provides the MATCH signal at 82 at the Q output, where the state of MATCH signal at 82 matches that at output 324 of inverter 322. The MATCH signal at 82 having a HIGH state indicates that external address XA matches a known defective row address. The delay provided by delay element is sufficient to allow comparator blocks 300 and wired-OR gate 310 to complete a comparison of XA at 40 to known defective row addresses.

Array redirector 76 further includes a plurality of memory locations 334a to 334x, each corresponding to one of the comparator blocks 300a to 300x and storing the array address of the memory array 14 associated with the corresponding comparator block 300. For example, memory locations 334a and 334x respectively store the array addresses for memory array <a> 14a and memory array <x> 14x.

Transmission gates 336, indicated as 336a to 336x, are positioned between each memory location 334 and bus 42, which provides the redirected array address to memory arrays 14. Transmission gates 336 are opened or closed based on the state of corresponding array match signals 308a to 308x. When the corresponding array match signal 308 has a HIGH state, transmission gate 336 is opens and provides at redirected array address bus 42 the array address stored in corresponding memory location 334; otherwise transmission gates 336 are closed.

The array address portion of external address XA at 40 is provided via bus 338. A transmission gate 338 is positioned between bus 338 and bus 42. An AND-gate 340 is coupled to the match# node 314 at a first input, and to the Q" output of D flip-flop 328 at a second input. Transmission gate 338 is opened or closed based on the state of the output of AND-gate 340. When the output of AND-gate 340 is HIGH, transmission gate 338 is opened and provides at bus 42 the external array address from bus 336. A pair of inverters 342 function as a latch to hold a present address on redirected array bus 42.

In operation, when the external address XA at 40 does not match any defective row addresses stored in comparator blocks 300, match# node 314 will be set HIGH followed thereafter by the Q" output of D flip-flop 328 being set HIGH. As a result, the output of AND-gate 340 is set HIGH, and the external array address at bus 332 is placed on the redirected array bus 42 via transmission gate 338.

If the external address XA at 40 matches one of the defective row addresses stored in comparator blocks 300, the comparator block 300 storing the matching defective row address will set its corresponding array match signal 308 HIGH. Consequently, match# node 314 is set LOW, resulting in the output of AND-gate 340 being set LOW and transmission gate 338 blocking the transmission of the external array address from bus 336 to redirected array bus 42. The array match signal 308 of the comparator having the matching defective row address and having the HIGH state will cause the transmission gate 336 of its corresponding memory location 334 to open and transfer the array addressed stored therein to redirected array bus 42. For example, if comparator block 300a associated with memory array <a> 14a has a defective row address stored therein that matches the external address XA at 42, comparator block 300 will set array match signal 308a HIGH. Consequently, the transmission gate 336a will be opened and the array address for memory array <a> 14a stored in memory location 334a will be placed on redirected array bus 42.

Figure 5B:
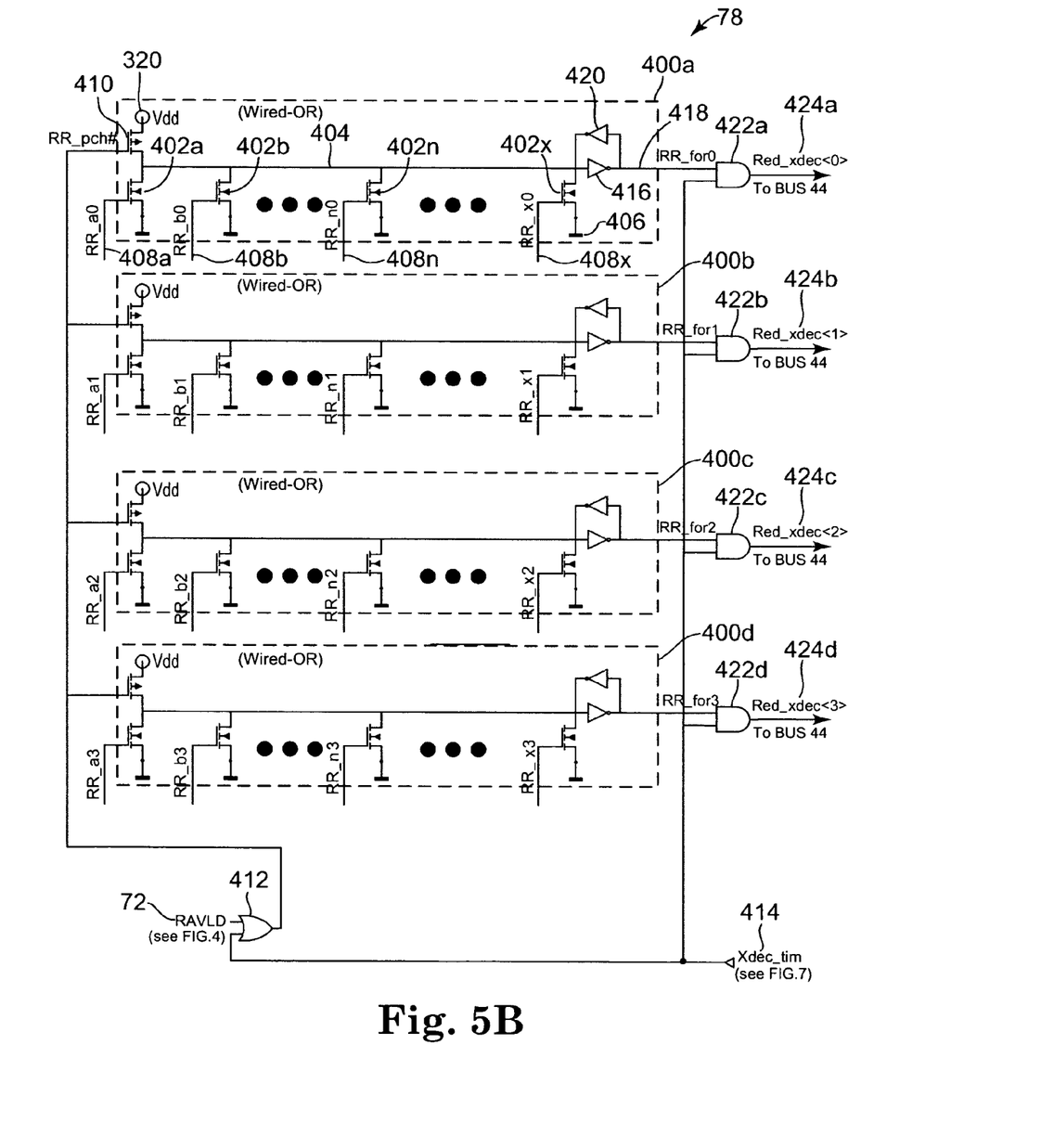
FIG. 5B is a schematic diagram illustrating one exemplary embodiment of a row redirector of a common row interface according to the present invention.

FIG. 5B is a schematic diagram illustrating one exemplary embodiment of a row redirector 78 of common row interface 12 according to the present invention. Row redirector 78 includes four wired-OR gates, indicated as 400a to 400d. Since each wired-OR gate 400 is similarly configured, only wired-OR gate 400a is described in detail herein.

Wired-OR gate 400a includes switches (e.g. transistors) 402 coupled between a node 404 and a reference node 406, such as ground. Each of the switches, indicated as 402a to 402x, corresponds to the first comparator circuit of the comparator blocks 300, with switch 402a corresponding to comparator block 300a and switch 402x corresponding to comparator block 300x. Furthermore, a control gate of each switch 402a to 402x receives from its corresponding comparator block 300a to 300x the row position match signal 304 corresponding to the first redundant row position, as indicated at 408a to 408x, wherein 408a corresponds to row position match signal 304a (RR_a0) from comparator circuit 302a (see FIG. 5A).

A voltage switch (e.g. a transistor) 410 is coupled between Vdd 320 and node 404. An OR-gate 412 receives the RAVLD signal at 72 from bank selector block 60 at a first input and row address timing signal (Xdec_tim) 414 (see FIG. 6) from central row controller 36. When RAVLD at 72 is set HIGH, voltage switch 410 closes and node 404 is set HIGH (to Vdd). If any of the row redundancy match signals 408a to 408x is set HIGH, indicating that XA at 40 is a defective address and that it has been logically assigned to a redundant row in the first redundant row position in one of the arrays 14a to 14x, node 404 is set LOW by pulling it to ground 406.

A first inverter 416 provides at its output a first redundant row position signal (RR_for0) at 418 having the opposite state of node 404, wherein RR_for0 418 has a HIGH state when a defective address has been logically assigned to a redundant row in the first redundant row position. A second inverter 420, together with first inverter 416, forms a latch to maintain RR_for0 418 at a present state until a next RAVLD 72 signal is received.

Each wired-OR gate 400a to 400d has an associated AND-gate 422, indicated as 422a to 422d. AND-gate 422a receives RR_for0 418 at a first input, and Xdec_tim 414 at a second input. When Xdec_tim 414 is set HIGH, AND-gate 422a provides at output 424 to bus 44 the redundant row signal Red_xdec<0 > corresponding to the first redundant row position, and having a state matching the state of RR_for) 418. Red_xdec<0> at 424a is set HIGH when the external address XA at 40 is a defective address and has been assigned to a redundant row in the first redundant row position, regardless of the memory array 14 in which the redundant row is located.

In a similar fashion, wired-OR gate 400b provides at 424b the redundant row signal Red_xdec<1> corresponding to the second redundant row position, wired-OR gate 400c provides at 424c the redundant row signal Red_xdec<2> corresponding to the third redundant row position, and wired-OR gate 400d provides at 424d the redundant row signal Red_xdec<3> corresponding to the fourth redundant row position. When referring to FIG. 2, Red_xdec<0> at 424a and Red_xdec<1> at 424b form the pair of redundant row signals 118a, and Red_xdec<2> at 424c and Red_xdec<3> at 424d form the pair of redundant row singals 118b.

Figure 6:
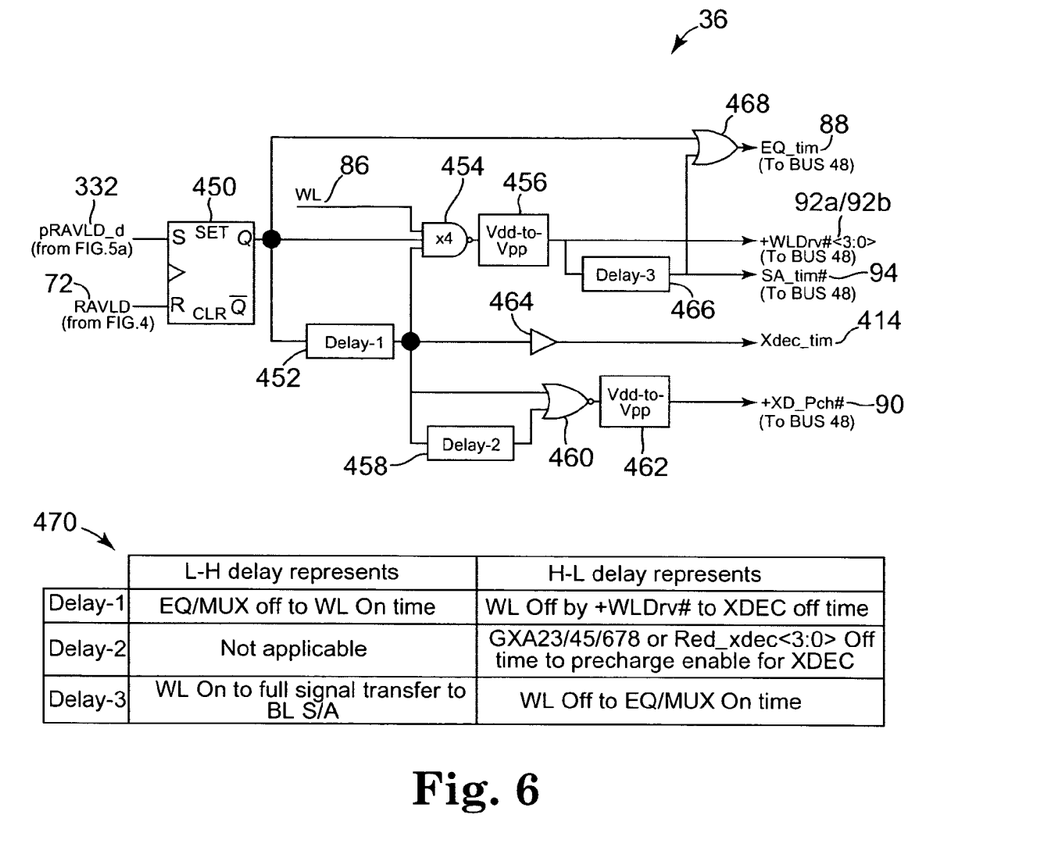
FIG. 6 is a block and schematic diagram illustrating one exemplary embodiment of central row controller of a common row interface according to the present invention.

FIG. 6 is a block and schematic diagram illustrating one exemplary embodiment of central row controller 36 of common row interface 12 according to the present invention. Row controller 36 includes an SR flip-flop, a first tunable delay element 452, a NAND-gate 454, a first voltage translator 456, a second tunable delay element 458, a NOR-gate 460, a second voltage translator 462, a buffer 464, a third tunable delay element 466, and an OR-gate 468.

SR flip-flop 450 receives pRAVLD_d 332 at the "S" input and RAVLD 72 at the "R" input. Because pRAVLD_d 332 is a delayed version of RAVLD 72, the Q output of SR flip-flop 450 is set LOW in response to RAVLD 72 and then set HIGH in response to pRAVLD-d 332. First tunable delay element 452 is coupled to the Q output of SR flip-flop 450 at an input, and provides at an output and via buffer 464 the Xdec_tim signal at 414.

NAND-gate 454 receives at a first input the driver signal 86 from predecoder 38 indicating which of the four wordline drivers of memory array <n> 14n is to be activated in response to the external address XA, is coupled to the Q output of SR flip-flop 450 at a second input, and is coupled to the output of tunable delay element 452 at a third input. An output of NAND-gate 456 is coupled to an input of the first voltage translator 456. First voltage translator 456 incrementally steps the output of NAND-gate 456 from Vdd (e.g. voltage supply rail) up to Vpp and provides at an output the wordline driver signals +WLDrv#<3:0> comprising the pairs of wordline driver signals +WLDrv#<2,0> 92a and +WLDrv#<3,1> 92b.

NOR-gate 460 is coupled at a first input to the output of first tunable delay element 452. Second tunable delay element 458 receives the output of the first tunable delay element 452 and has an output coupled to a second input of NOR-gate 460. An output of NOR-gate 460 is coupled to an input of second voltage translator 462. Second voltage translator 456 incrementally steps the output of NOR-gate 460 from Vdd up to Vpp and provides at an output the +XD_pch# signal 90.

Third tunable delay element 466 receives the output of the first voltage translator 456 and provides the SA_tim# 94 at an output. OR-gate 468 is coupled to the Q output of SR flip-flop 450 at a first input, receives the output of third tunable delay element 466 at a second input, and provides at an output the EQ_tim signal 88.

Table 470 summarizes the relationship of the delays provided by delay elements 452, 456, and 458 between the timing and access signals associated with a memory array row operation.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory receiving an external address including an array address and a row address, the memory comprising:
   N memory arrays, each memory array having an array address and a plurality of normal and redundant rows of memory cells;
   a redundancy block providing a match signal having an active state when the external address matches one of a plurality of defective addresses, providing a redundant row address when the match signal has the active state, and providing a redirected array address comprising a redundant array address when the match signal has the active state and otherwise comprising the external array address; and
   N local row control blocks, each associated with a different one of the N memory arrays, wherein the local row control block associated with the memory array whose array address matches the redirected array address opens a redundant row of memory cells for access based on the redundant row address when the match signal has the active state and otherwise opens a normal row of memory cells for access based on the external row address.

2. The memory of claim 1, wherein the semiconductor memory comprises a random access memory.

3. The memory of claim 1, wherein the N memory arrays, the N local row control blocks, and the redundancy block together comprise a memory bank.

4. The memory of claim 3, wherein the memory comprises a plurality of memory banks, each memory bank having a bank address and having a corresponding redundancy block; the memory further comprising:
a plurality of a bank controllers, each of the bank controllers associated with a different one of the plurality of memory banks and configured to receive the external address and an external bank address; wherein the bank controller associated with the memory bank whose bank address matches the external bank address is configured to provide the external address to the memory bank's associated redundancy block.

5. The memory of claim 3, wherein the memory bank further comprises:
a central row controller, based on the redundancy block providing the redirected array address, configured to provide a series of timing signals associated with a row operation, wherein the local row control block associated with the array whose address matches the redirected array address is configured to provide to the array a series of access signals associated with the row operation, wherein the access signals are based on the timing signals, the redirected array address, the external row address, and the redundant row address.

6. The memory of claim 5, wherein the redundancy block and the central row controller together comprise a common row interface.

7. The memory of claim 5, wherein each of the timing signals includes transitions between active and inactive states, and wherein the central row controller includes a plurality of time delay elements configured to control time delays of the timing signal transitions relative to one another such that the transitions of the timing signals occurs in a predetermined order.

8. The memory of claim 7, wherein the time delay elements are tunable such that the corresponding time delays can be adjusted.

9. The memory of claim 7, wherein the common row interface further comprises:
a predecoder providing a predecoded row address representative of the external row address, wherein the local row control block opens a normal row of memory cells for access based on the predecoded row address.

10. The memory of claim 1, wherein the redundancy block comprises:
an array redirector having the plurality of defective addresses stored therein, each having a corresponding redundant row of memory cells assigned as a replacement row and having a redundant array address and a redundant row address, the array redirector configured to compare the external address to each of the defective addresses, and when the external address matches one of the defective addresses, configured to provide the redirected array address comprising the redundant array address corresponding to the matching defective address; and
a row redirector, when a match occurs, configured to provide the redundant row address comprising the redundant row address corresponding to the matching defective address.

11. The memory device of claim 10, wherein each array has a same number of redundant rows of memory cells located at a same plurality of redundant row positions within each array, and wherein each redundant row of memory cells can be assigned as a replacement for a corresponding one of the defective addresses.

12. The memory device of claim 11, wherein each array includes four redundant rows of memory cells at a same four row positions within each array.

13. The memory of claim 11, wherein the array redirector further comprises:
N comparator blocks, each corresponding to one of the N arrays each and comprising:
a plurality of comparator circuits, each corresponding to one of the redundant row positions within the corresponding array and storing therein the defective address of a defective row of memory cells for which the corresponding redundant row position has been assigned as a replacement, and configured to compare the external address to the defective address stored therein and to provide a row position signal having an active state when a match occurs; and
a combiner configured to provide an array match signal associated with the corresponding array having an active state when any one of the row position signals has the active state; and
N memory locations, each associated with one of the N comparator blocks and each storing the array address of the array corresponding to the associated comparator block, and configured to provide the array address stored therein as the redundant array address in response to the array match signal from the corresponding comparator block having the active state.

14. The memory of claim 13, wherein the combiner comprises an OR-gate.

15. The memory of claim 13, wherein the array redirector further comprises a combiner configured to provide the match signal having the active state when any one of the array match signals from the N comparator blocks has the active state, and is configured to provide the external array address as the redundant array address when the match signal does not have the active state.

16. The memory of claim 15, wherein the combiner comprises a wired OR-gate.

17. The memory of claim 13, wherein the row redirector further comprises:
a plurality of combiner blocks, each corresponding to a different one of the redundant row positions and configured to receive from each of the N comparator blocks the row position signal from the comparator circuit associated with the corresponding redundant row position, each combiner block configured to provide a redundant row signal having a state based on the states of the row position signals, wherein the redundant row signals from each the of the combiners together form the redundant row address.

18. The memory of claim 13, wherein each of the combiner blocks comprises a wired OR-gate.

19. A semiconductor memory receiving an external address including an array address and a row address, the memory comprising:
a memory bank having N arrays, each array having an array address and a plurality of rows of memory cells;
a central row controller, in response an activate command indicative of a bank transaction having an active state, configured to provide a series of timing signals associated with a row operation; and
N local control blocks, each associated with a different one of the N arrays, wherein the local control block associated with the array whose address matches the external array address is configured to provide to the array a series of access signals associated with row operation, wherein the access signals are based on the timing signals, the array address, and the row address.

20. The memory of claim 19, wherein the central row controllers provides each of the timing signals with transitions between active and inactive states, and wherein the central row further includes a plurality of time delay elements configured to control time delays of the timing signal transitions relative to one another such that the transitions of the timing signals occurs in a predetermined order.

21. The memory of claim 20, wherein the time delay elements are tunable such that the corresponding timing delays can be adjusted.

22. A method of operating a random access memory device including N memory arrays, each memory array having an array address and a plurality of normal and redundant rows of memory cells, the method comprising:

receiving an external address including an array address and a row address;

providing a match signal having an active state when the external address matches one a plurality of defective addresses;

providing a redundant row address when the match signal has the active state;

providing a redirected array address comprising a redundant array address when the match signal has the active state and otherwise comprising the external array address.

23. The method of claim 22, further comprising:

opening a redundant row of memory cells for access based on the redundant row address when the match signal has the active state, otherwise opening a normal row of memory cells for access based on the external row address.

* * * * *